United States Patent
Lin et al.

[11] Patent Number: 6,057,208
[45] Date of Patent: May 2, 2000

[54] METHOD OF FORMING SHALLOW TRENCH ISOLATION

[75] Inventors: Tony Lin, Kao Hsiung Hsien; Heng-Sheng Huang, Taipei, both of Taiwan

[73] Assignee: United Microelectronics Corp., Hsin-Chu, Taiwan

[21] Appl. No.: 09/057,905

[22] Filed: Apr. 9, 1998

[30] Foreign Application Priority Data

Dec. 27, 1997 [TW] Taiwan ................................. 86119851

[51] Int. Cl.[7] ..................................................... H01L 21/76
[52] U.S. Cl. ........................ 438/424; 438/296; 438/246; 438/359
[58] Field of Search ..................................... 438/424, 296, 438/219, 246, 248, 359, 433, 437, 427

[56] References Cited

U.S. PATENT DOCUMENTS

| | | | |
|---|---|---|---|
| 5,316,965 | 5/1994 | Philipossain et al. | 438/424 |
| 5,728,621 | 3/1998 | Zheng et al. | 438/427 |
| 5,733,383 | 3/1998 | Fazan et al. | 438/424 |
| 5,960,298 | 9/1999 | Kim | 438/424 |

OTHER PUBLICATIONS

Stanley Wolf Silicon Processing for the VLSI Era vol. 3 Lattice Press p. 345, 1995.

S. M. Sze VLSI Technology McGraw Hill Book Company p. 268, 1988.

*Primary Examiner*—Charles Bowers
*Assistant Examiner*—David S Blum
*Attorney, Agent, or Firm*—Thomas, Kayden, Horstemeyer & Risley

[57] ABSTRACT

A method of forming a shallow trench isolation structure is disclosed. A dielectric layer deposited by chemical vapor deposition is used as a sacrificial layer instead of conventional sacrificial oxide layer formed by thermal oxidation. Therefore, the oxide in the trench is further protected and less damaged.

23 Claims, 4 Drawing Sheets

METHOD OF FORMING SHALLOW TRENCH ISOLATION

CROSS-REFERENCE TO RELATED APPLICATION

This application claims the priority benefit of Taiwan application Ser. No. 86119851, filed Dec. 27, 1997, the full disclosure of which is incorporated herein by reference.

BACKGROUND OF THE INVENTION

1. Field of the Invention

The invention relates in general to a method of fabricating an integrated circuit (IC), and more particularly to a method of fabricating an isolation structure to isolate devices in order that the devices can normally operate.

2. Description of the Related Art

A complete IC is composed of thousands of transistors. To prevent short circuit occurring between adjacent transistors, isolation structures have to be formed to isolate the transistors. Isolation structures are usually in the form of thick oxide, which are formed on the surface of the semiconductor substrate. One of the most commonly used isolation structures is local oxidation of silicon (LOCOS). The LOCOS technique is now a mature technique with lower cost and high reliability. However, some drawbacks of the LOCOS technique still exist, including undesired stress and bird's beak. Especially, bird's beak results in noneffective isolation for small size devices. Therefore, it is not suitable for high density semiconductor devices.

Shallow trench isolation (STI) structures are now widely used for IC devices isolation. Typically, silicon nitride is used as a hard mask to etch the semiconductor substrate anisotropically to form a substantially vertical trench. Then, the trench is filled with oxide to be a device isolation structure. The upper surface of the isolation structure is about at the same level as the upper surface of the original substrate. The thickness of the STI structure provides effective isolation and is suitable for smaller size devices. Also, the STI technique provides a overall planarized surface. Therefore, the STI structure takes place of the conventional LOCOS structure to be applied in a number of device isolation techniques such as dynamic random access memory (DRAM).

A conventional process for fabricating a STI structure is illustrated as followed.

Referring to FIG. 1A, a pad oxide layer 11 and a silicon nitride layer 12 are successively formed over the substrate 10. Next, after forming a photoresist layer 13, the substrate 10 is then patterned by anisotropically etching, using the photoresist layer 13 as a mask so that a trench 14 is formed. The trench 14 has a periphery and exposes the inner surface of the substrate 10.

Next, referring to FIG. 1B, after removing the photoresist layer 12, a thermal oxidation process is performed. The substrate 10 is placed at a furnace containing dry oxygen, at a temperature of about 850~950° C. so that an oxide layer 16 is formed to cover the trench 14. The oxide layer 16 is a silicon dioxide layer, with a thickness of about 200~600 Å. This oxide layer 16 is used as liner oxide. Then, an insulating layer 17 is deposited by low pressure chemical vapor deposition (LPCVD), which covers the oxide layer 16. The insulating layer 17 is an oxide produced by using the TEOS as gas source. The oxide is then processed through densification.

Next, referring to FIG. 1C, the insulating layer 17 and the silicon nitride layer 12 are polished by chemical mechanical polishing (CMP) until substantially a portion of the silicon nitride layer 12 is left on the substrate 10 wherein the remaining silicon nitride layer 12 has a thickness of about hundreds of Å. Then, a conventional cleaning step, using fluoric acid solution to wash the exposed substrate 10, is performed to obtain hydrophobic substrate surface. Alternatively, using perhydroxyl oxide to wash the exposed substrate 10 to obtain a hydrophilic substrate surface.

Next, referring to FIG. 1D, oxygen is introduced into a furnace at a temperature of about 850~950° C. to form a sacrificial oxide layer 18, covering the substrate 10, the insulating layer 17a. Conventional ion implantation processes are then performed to form wells and channel stop layer(not shown) at the substrate 10 and also to adjust the threshold voltage. Diluted fluoric acid is then used to wash the substrate and to remove the sacrificial oxide layer 18. A gate oxide layer 18' shown in FIG. 1E is then formed in a furnace.

Generally, during the process of using the flouric acid to wash the sacrificial oxide layer 18, the oxide layer 16 is usually over etched because the difference of the etching rate of the sacrificial oxide layer and the liner oxide layer 16. As a result, the upper surface of the oxide layer 16 around the periphery of the trench becomes lower than the upper surface of the substrate, as shown in FIG. 1E. Overetching occurring at the junction of the oxide layer 16 and the surface of the substrate 10 forms concave 19. In the continuing processes, as a conductive structure is formed over the concave 19, the current in the conductive structure will flow into other device structure, which results in an undesired electrical coupling of the devices and the conductive structure. This effect is so-called kink effect.

The STI structure has been widely for the process of less than 0.25 $\mu$m. However, the most serious problem is that concave usually forms at the periphery of the trench as the flouric acid is usually for cleaning the sacrificial oxide layer, which results in so-called subthreshold kink effect. Especially, during the process of dual gate oxide layer, the problem caused by flouric acid washing becomes even more serious. Within the processes of forming n-type and p-type gate, the kink effect of the PMOS is more serious than the kink effect of the NMOS because the doping dosage of phosphorous or arsenic in the n-well is higher than the doping dosage of boron or flouric boron in the p-well, the damage of the oxide for the PMOS STI structure is more serious and the concave becomes more apparent.

SUMMARY OF THE INVENTION

It is therefore an object of the invention to provide a method of shallow trench isolation without kink effect.

It is therefore another object of the invention to provide a method of shallow trench isolation without kink effect, which consequently increases the performance of the devices.

The invention achieves the above-identified objects by providing a method of forming a shallow trench isolation structure. An etching stop layer is first formed on the substrate. A trench is then formed on the substrate. An insulating layer is formed to fill in the trench and to cover the substrate. A portion of the insulating layer is removed to expose a surface of the substrate. A dielectric layer is formed over the substrate and the insulating layer by chemical vapor deposition.

BRIEF DESCRIPTION OF THE DRAWINGS

Other objects, features, and advantages of the invention will become apparent from the following detailed descrip

DESCRIPTION OF THE PREFERRED EMBODIMENT

Figure 1A:
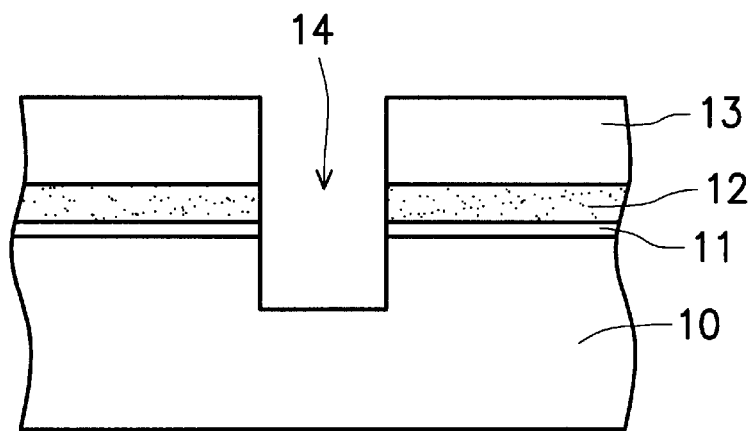
- FIGS. 1A to 1E are cross sectional views showing a process of fabricating a conventional shallow trench isolation structure.
Figure 1B:
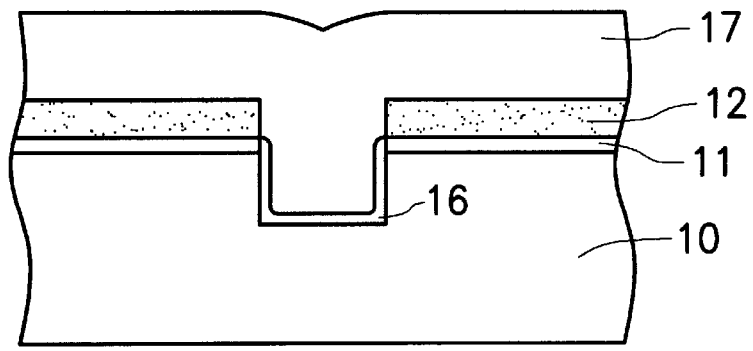
Figure 1C:
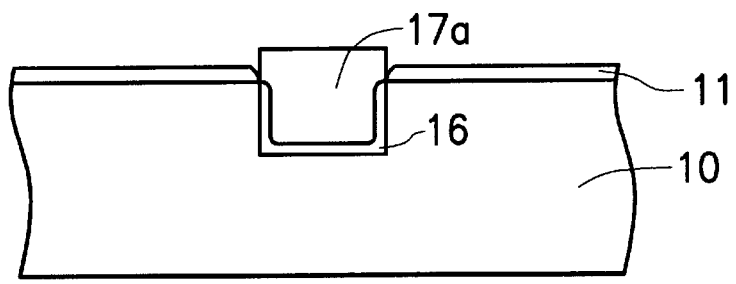
Figure 1D:
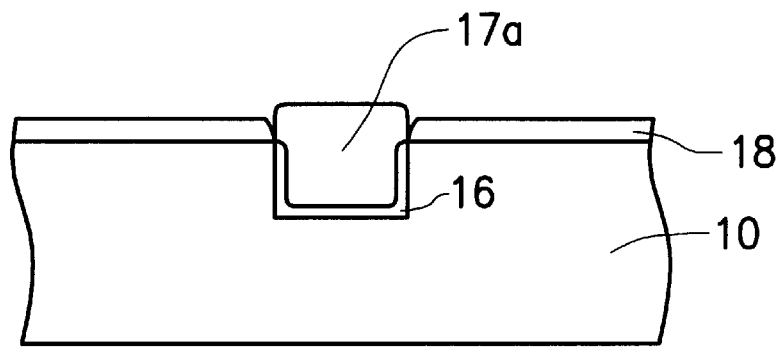
Figure 1E:
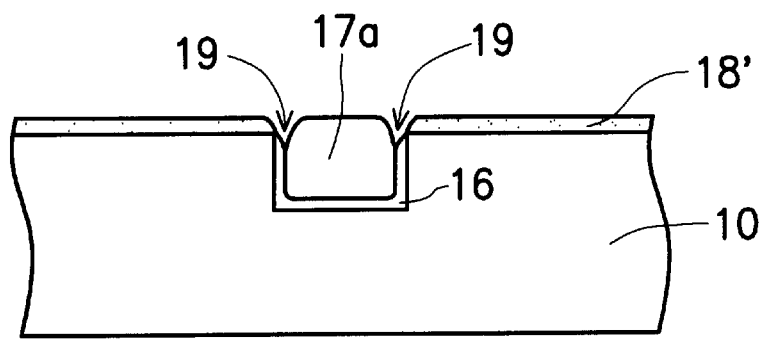
Figure 2A:
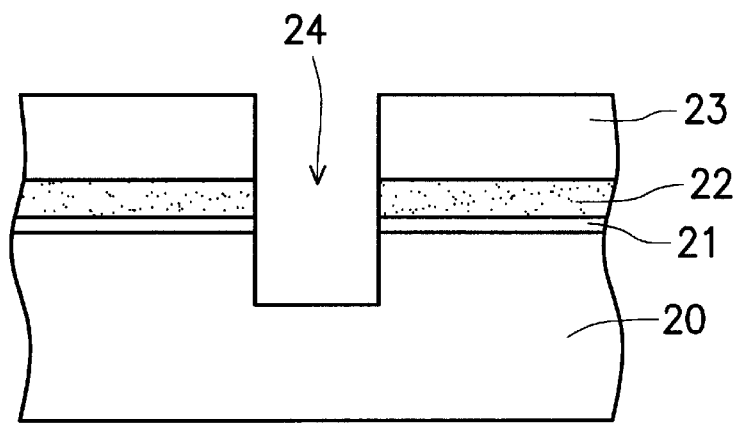
FIGS. 2A to 2E are cross sectional views showing a process of fabricating a shallow trench isolation structure in accordance with a preferred embodiment of the invention.

Referring to FIG. 2A, a pad oxide layer 21 and a silicon nitride layer 22 are successively formed on a semiconductor substrate 20. Then, a photoresist layer 23 is formed on the silicon nitride layer 22. After the process of photolithography, a trench 24 is formed on the substrate 20. The silicon nitride layer 22 is usually used as an etching stop layer. A silicon nitride layer 22 can be previously formed over the substrate to be used as an etching stop layer and an etching end point for the continuous etching process. Other structure such as a pad oxide layer can also be formed. The pad oxide layer can be formed, for example, by chemical vapor deposition (CVD) to prevent the surface of the substrate from being damaged. The pad oxide layer can be a high quality gate oxide layer. The thickness of the pad oxide layer can be formed as desired but has to be thick enough to protect the substrate. If the etching stop layer or the mask layer is compatible with the substrate, it will not be necessary to form a pad oxide layer. However, a silicon nitride layer is usually used as an etching stop layer to release the pressure or stress in the continuing processes. The etching stop layer, such as a silicon nitride layer, can be an etching stop layer as removing oxide. Moreover, during the formation of trenches, a number of layers with different materials have to be removed so that the etching process is preferrably highly anisotropical, such as a reactive ion etching process (RIE), using a mixture of gas as an etchant, to etch the substrate.

Figure 2B:
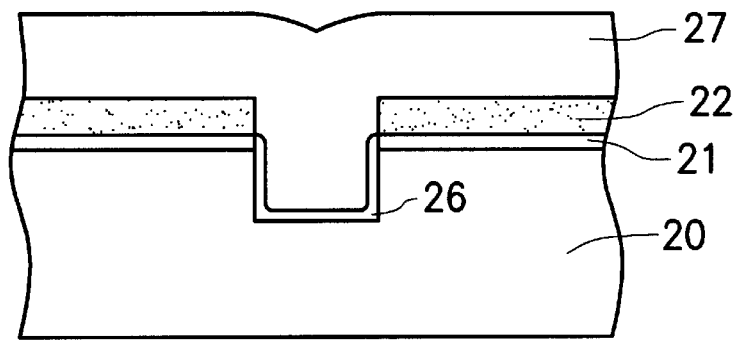

Referring to FIG. 2B, after the photoresist layer 22 is removed, an insulating layer 27 is formed over the silicon nitride layer 22 on the substrate 20 and over the trench 24. The insulating layer 27 can be a silicon oxide layer formed by atmosphere chemical vapor deposition (ATCVD), using TEOS as gas source. The formed silicon oxide layer is then densified at a temperature of about 1000° C. for about 10~30 minutes. Before filling the insulating material 27 into the trench 24, a liner oxide layer 26 is preferrably formed to cover the substrate 20 and the periphery and inner surface of the substrate 20 in the trench 24 by thermal oxidation at a temperature of about 850~950° C. The thickness of the liner oxide layer can be about 200~600 Å.

Figure 2C:
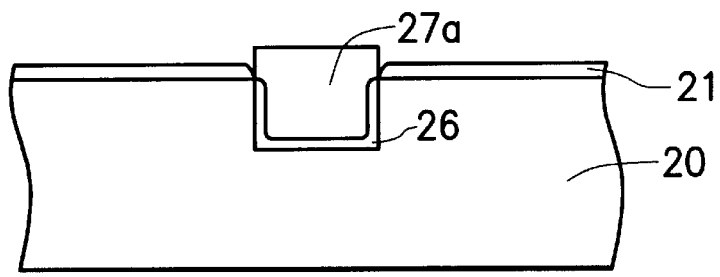

Then, referring to FIG. 2C, a portion of the insulating layer 27 and a portion of the silicon nitride layer 22 are removed to obtain a planarized surface and to expose the remaining silicon nitride layer 22 with a thickness of about hundreds of Å. The removing of a portion of the insulating layer 27 and a portion of the silicon nitride layer 22 can be achieved by CMP. Consequently, portions of the liner oxide layer 26 and the insulating layer 27a are maintained.

Figure 2D:
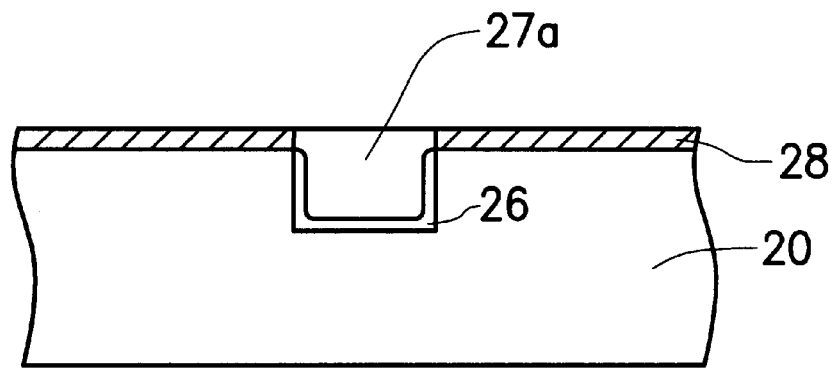

Next, referring to FIG. 2D, after removing the remaining silicon nitride layer 22 and the pad oxide layer 21, a dielectric layer 28 is formed over the substrate 20 by CVD. The composition of the dielectric layer 28 can be oxide, silicon-oxy-nitride or silicon nitride. Conventional ion implantation processes are performed to adjust the threshold voltage of the substrate 20, to form wells with different doping type from the substrate or channel stop layer (not shown). The dielectric layer 28 is used as a sacrificial layer to prevent the damage resulted from ion implantation.

Figure 2E:
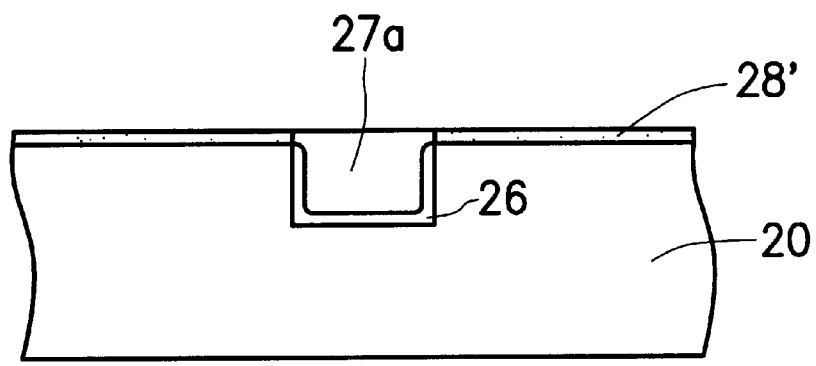

Next, referring to FIG. 2E, the dielectric layer 28 is removed to expose the insulating layer 27a and the substrate 20. A gate oxide layer 28' is then grown in a finance. Consequently, the junction 29 of the insulating layer 27a and trench is a planarized surface. As the dielectric layer 28 is silicon oxide, it can be removed by diluted flouric acid. As the dielectric layer 28 is silicon-oxy-nitride, it can be removed by phosphoric acid.

Therefore, one of the characteristics of the invention is forming the sacrificial layer by CVD instead of the conventional method of thermal oxidation. A sacrificial oxide layer formed by thermal oxidation is more easily damaged during the removing step, which therefore results in Kink effect. However, a sacrificial oxide layer formed by CVD provides better protection for the insulating material in the trench, especially during the ion implantation process.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming shallow trench isolation, comprising:

providing a substrate, wherein an etching stop layer is formed on the substrate;

forming a trench within the substrate;

forming an insulating layer to fill in the trench and to cover the substrate;

removing a portion of the insulating layer to expose the substrate;

forming a dielectric layer over the substrate and the insulating layer by chemical vapor deposition;

performing an ion implantation, wherein the dielectric layer is used as a sacrificial layer to prevent damage resulting from ion implantation; and completely removing the dielectric layer without forming a concave recess at a junction between the insulating layer and the substrate.

2. A method as claimed in claim 1, wherein said step of forming the trench within the substrate further comprises:

forming a photoresist layer over the etching stop layer;

patterning the photoresist layer:

removing a potion of the etching stop layer and a portion of the substrate to form a trench within the substrate; and removing the photoresist layer.

3. A method as claimed in claim 1, wherein the etching stop layer includes silicon nitride.

4. A method as claimed in claim 1, wherein the insulating layer includes oxide.

5. A method as claimed in claim 4, wherein after said step of forming the insulating layer to fill in the trench, a process of densification is further performed onto the insulating layer.

6. A method as claimed in claim 5, wherein the process of densification includes a step of heating the insulating layer.

7. A method as claimed in claim 4, wherein the insulating layer is formed by atmosphere chemical vapor deposition.

8. A method as claimed in claim 4, wherein the insulating layer is formed by using TEOS as gas source.

9. A method as claimed in claim 1, wherein said step of removing the portion of the insulating layer is performed by chemical mechanical polishing (CMP).

10. A method as claimed in claim 1, wherein the dielectric layer is oxide.

11. A method as claimed in claim 1, wherein the dielectric layer is silicon-oxy-nitride.

12. A method as claimed in claim 1, wherein the dielectric layer is silicon nitride.

13. A method as claimed in claim 1, after said step of forming the dielectric layer, further comprising:

performing an ion implantation process to form a well within the substrate; and removing the dielectric layer.

14. A method as claimed in claim 13, wherein flouric acid is used for removing the dielectric layer.

15. A method as claimed in claim 13, wherein phosphoric acid is used for removing the dielectric layer.

16. A method of forming shallow trench isolation, comprising:

providing a substrate;

forming a silicon nitride layer over the substrate;

etching the silicon nitride layer and the substrate to form a trench;

forming an insulating layer to fill in the trench and to cover the silicon nitride layer;

removing a portion of the insulating layer to expose the silicon nitride layer;

performing a chemical vapor deposition process to for a dielectric layer on the silicon nitride layer and the insulating layer;

performing an ion implantation process, wherein the dielectric layer is used as a sacrificial layer to prevent damage resulting from ion implantation; and completely removing the dielectric layer without forming a concave at a junction between the insulating layer and substrate.

17. A method as claimed in claim 16, wherein the insulating layer includes oxide.

18. A method as claimed in claim 16, wherein the portion of the insulating layer is removed by chemical mechanical polishing.

19. A method as claimed in claim 16, wherein the dielectric layer includes oxide.

20. A method as claimed in claim 19, wherein flouric acid is used for removing the dielectric layer.

21. A method as claimed in claim 16, wherein the dielectric layer includes silicon-oxy-nitride.

22. A method as claimed in claim 21, wherein phosphoric acid is used for removing the dielectric layer.

23. A method as claimed in claim 16, wherein the dielectric layer includes silicon nitride.

* * * * *